United States Patent
Fujinawa et al.

(10) Patent No.: US 7,462,927 B2
(45) Date of Patent: Dec. 9, 2008

(54) PATTERN FILM FORMING METHOD AND PATTERN FILM FORMING APPARATUS

(75) Inventors: Jun Fujinawa, Kanagawa (JP); Junji Nakada, Shizuoka (JP); Norio Shibata, Kanagawa (JP); Takashi Kataoka, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 244 days.

(21) Appl. No.: 11/034,805

(22) Filed: Jan. 14, 2005

(65) Prior Publication Data
US 2005/0150865 A1 Jul. 14, 2005

(30) Foreign Application Priority Data
Jan. 14, 2004 (JP) ............................. 2004-006800

(51) Int. Cl.
H01L 23/02 (2006.01)
H01L 21/00 (2006.01)
H01L 21/20 (2006.01)

(52) U.S. Cl. ..................... 257/678; 438/106; 438/584

(58) Field of Classification Search ............... None
See application file for complete search history.

(56) References Cited

U.S. PATENT DOCUMENTS

| | | | |
|---|---|---|---|
| 3,915,780 A | * | 10/1975 | Broussard et al. .......... 156/243 |
| 6,099,678 A | * | 8/2000 | Kotato et al. ............... 156/256 |
| 6,284,307 B1 | | 9/2001 | Fukuzawa et al. |
| 6,689,245 B2 | * | 2/2004 | Tsujimoto .................. 156/267 |
| 2003/0062116 A1 | * | 4/2003 | Lee ............................ 156/249 |
| 2004/0188814 A1 | * | 9/2004 | Houle et al. ................ 257/678 |
| 2004/0200061 A1 | * | 10/2004 | Coleman et al. ............. 29/825 |

FOREIGN PATENT DOCUMENTS

| JP | 2918037 B1 | 4/1999 |
|---|---|---|
| JP | 2003-139944 A | 5/2003 |
| JP | 2003-173870 A | 6/2003 |

\* cited by examiner

*Primary Examiner*—Carl Whitehead, Jr.
*Assistant Examiner*—James M Mitchell
(74) *Attorney, Agent, or Firm*—Sughrue Mion, PLLC

(57) ABSTRACT

A pattern film forming method includes a step of producing a transfer sheet in which a thin film is formed on a surface of a sheet-shaped material and a step of pressing the thin film against a pattern film formation surface of the substrate with a pressing member having convex portions corresponding to the pattern film from a reverse surface of the transfer sheet opposite to the thin film or a reverse surface of the substrate opposite to the pattern film formation surface to transfer the thin film to the substrate. A pattern film forming apparatus includes a sheet supply device, a pressing device and a substrate transport device. A high-definition pattern film having a desired pattern and a sharp edge can be formed with high productivity.

12 Claims, 3 Drawing Sheets

PATTERN FILM FORMING METHOD AND PATTERN FILM FORMING APPARATUS

This application claims priority on Japanese patent application No. 2004-006800, the entire contents of which are hereby incorporated by reference. In addition, the entire contents of literatures cited in this specification are incorporated by reference.

BACKGROUND OF THE INVENTION

The present invention relates to a technical field of pattern film formation by vacuum film formation. More specifically, the present invention relates to a pattern film forming method and a pattern film forming apparatus capable of forming a high-definition pattern film having a desired pattern and a sharp edge with high productivity.

Known methods of forming a pixel (illuminator) of an organic EL element are roughly classified into three kinds (combination of white electroluminescence and color filters, color conversion, and vapor-deposition with masking).

According to the combination of the white electroluminescence and color filters, a white organic EL layer is formed over the entire surface, and an R (red) filter, a G (green) filter, and a B (blue) filter corresponding to pixels are formed on the surface of the white organic EL layer, whereby light of three colors of R, G, and B is obtained. Furthermore, according to the color conversion, a blue light-emitting layer is formed over the entire surface, and a color conversion layer corresponding to pixels is formed on the blue light-emitting layer, whereby B-light is converted to R-light, and B-light is converted to G-light; thus, light of three colors of R, G, and B is obtained.

In both the methods, it is not necessary to form a patterned light-emitting layer, so that those methods are satisfactory in terms of productivity, and the like. However, according to the former method, filters cut off the unnecessary wavelength range, which decreases the light-emission efficiency. Furthermore, according to the color conversion, the efficiency of the conversion by the color conversion layer is low, which also decreases the light-emission efficiency.

On the other hand, according to the vapor-deposition with masking, light-emitting layers of respective colors of R, G, and B are patterned on the surface of a substrate, using a mask having a pattern corresponding to pixels (formation of a pattern film). Furthermore, as another method using a mask, JP 2003-173870 A discloses a method involving: forming a pattern film of a light-emitting layer on a transfer substrate using a mask; laminating together the transfer substrate and a substrate on which the light-emitting layer is to be transferred; and transferring the pattern film of the light-emitting layer onto the substrate, and a method involving: forming a light-emitting layer over the entire surface of a transfer substrate; laminating together the transfer substrate and a substrate on which the light-emitting layer is to be transferred through a mask; and transferring the light-emitting layer by heating, thereby forming a pattern film of the light-emitting layer on the substrate.

Thus, by forming a patterned light-emitting layer, individual pixels are allowed to emit light and can be controlled. Furthermore, there is no decrease in light-emission efficiency due to a filter and the like. Therefore, an image can be displayed with very high light-emission efficiency.

However, a very thin mask is necessary to form a preferable pattern film. Furthermore, a light-emitting layer formed of an organic EL element has usually a fine pattern, which makes the mask production difficult. Since the mask produced is thin and is easily broken, the handling properties in alignment and carrying are very poor. Furthermore, according to the method in which a film is formed by vapor deposition or the like using a mask, it is necessary to wash the mask each time film formation is conducted, which is laborious and may lead to breakage of the mask during washing. Display apparatuses are recently upsized. The larger the mask is, the more marked this problem is.

In contrast, a method in which a pattern film of a light-emitting layer is formed through transfer without using a mask is also known.

For example, JP 2918037 B discloses a method of producing a color organic EL display. This method includes the steps of: vapor-depositing a light-emitting layer (light-emitting organic material) on a transfer substrate having highly heat-conductive convex portions patterned in accordance with display pixels; clamping the transfer substrate onto a transparent conductive film substrate (or a positive hole transport layer formed on the transparent conductive film); and heating the convex portions on the transfer substrate to sublimate the light-emitting layer, thereby transferring the light-emitting layer onto the surface of the transparent conductive film substrate.

Furthermore, JP 2003-173870 A also discloses a method involving: forming a light-emitting layer by vapor deposition on an uneven surface of a band-shaped transfer substrate having irregularities corresponding to a pattern film of a light-emitting layer to be formed; and heating the transfer substrate from the side opposite to the uneven surface, thereby transferring the pattern film of the light-emitting layer to a substrate on which the pattern film is to be transferred.

However, according to the method disclosed in JP 2918037 B, a transfer substrate is heated to a high temperature close to 500° C. to transfer a film formation material to a substrate (substrate on which the film formation material is to be formed) by sublimation. Therefore, no pattern film made of a material having low heat resistance can be formed. Furthermore, in view of productivity, the material for the pattern film is limited to those which have satisfactory sublimation property and evaporation property, and heat resistance is also required in the transfer substrate; therefore, the range of choice for the material of the light-emitting layer and the transfer substrate are narrow and this method has no degree of freedom or versatility. Simultaneous sublimation in the periphery of pixels cannot be avoided. Therefore, pixels having sharp edge cannot be formed. Furthermore, this method discloses laser light as a preferable heating means, but it is difficult to keep the positional precision of laser irradiation, and it is also difficult to keep high productivity.

Furthermore, according to the method in which a light-emitting layer is formed on an uneven transfer layer by means of vapor deposition or the like, a light-emitting material that is not used is deposited in concave portions, so that it is necessary to wash the transfer substrate periodically, and furthermore, the light-emitting material deposited in the concave portions will become waste.

In contrast, according to the method of producing a pattern sheet through transfer, as disclosed in commonly assigned JP 2003-139944 A, the above-mentioned problem can be solved.

According to this method, a monochrome film is produced, in which a color ink layer obtained by coating/drying ink (coating) prepared by dissolving a polymer organic light-emitting material, a polymer binder, and the like in an organic solvent is formed on a film material; the monochrome film and a sheet as a substrate on which a pattern film is to be formed are laminated together so that the color ink layer comes into contact with the sheet; and the laminate thus obtained is pressed with a pressing member having irregularities corresponding to the pattern film to be formed, whereby the pattern film made of the color ink is formed on the sheet. According to the method disclosed in JP 2003-139944 A, monochrome films whose number corresponds to the number of colors for a pattern to be formed are produced and a multi-color pattern sheet is produced by successively transferring the monochrome films on the sheet.

According to the method disclosed in JP 2003-139944 A, a light-emitting layer having a pattern corresponding to pixels can be formed with high productivity by means of a simple facility and control without using a mask and without heating at high temperature and the like. Furthermore, the pressing member having irregularities corresponding to the pattern does not come into direct contact with the light-emitting layer (light-emitting material). Therefore, unlike the case where a film is formed on a transfer member with irregularities formed thereon, the waste of the material for the pattern film such as a light-emitting material can be prevented, and washing of the pressing member can also be made unnecessary.

However, according to the method disclosed in JP 2003-139944 A, since the adhesion between the film material and the color ink layer is high, the transfer property of the monochrome film onto the sheet is low, and the binding force in the film is strong, so that the color ink layer is unlikely to be broken. Therefore, for applications requiring high productivity, sharpness in the edge portion, and a-high-definition pattern, it is difficult to preferably apply the above method. Thus, there is a demand for a method of forming a pattern film capable of producing a pattern film having higher sharpness and higher definition with higher productivity.

SUMMARY OF THE INVENTION

An object of the present invention is to solve the problems in the above-mentioned prior art and to provide a pattern film forming method in which a thin film having a high-definition pattern with sharp edge can be formed with high productivity at low cost, the use efficiency of a film formation material is high, and the degree of freedom in selection of a formation material for a pattern film, a substrate, and the like is high.

Another object of the present invention is to provide a pattern film forming apparatus using the pattern film forming method.

In order to achieve the above object, according to a first aspect of the present invention, there is provided a pattern film forming method for forming a pattern film having a predetermined pattern on a substrate, including: producing a transfer sheet in which a thin film is formed by means of a vacuum film forming method on a surface of a sheet-shaped material; and pressing the thin film against a pattern film formation surface of the substrate with a pressing member having convex portions corresponding to the pattern film from one of a reverse surface of the transfer sheet opposite to the thin film and a reverse surface of the substrate opposite to the pattern film formation surface to thereby transfer the thin film to the substrate.

In the pattern film forming method according to the first aspect of the invention, it is preferable that a transfer portion is heated when the thin film is pressed with the pressing member. Further, it is preferable that a treatment for imparting peeling property to the surface of the sheet-shaped material is performed before the thin film is formed on the surface of the sheet-shaped material. Further, it is preferable that a treatment for imparting adhesion to at least one of a surface of the thin film and a surface of the substrate is performed before pressing the thin film with the pressing member. Further, it is preferable that the transfer sheet comprises a long sheet, and the long transfer sheet is transported intermittently in a longitudinal direction, and a region stopped at a predetermined position is pressed with the pressing member. Further, it is preferable that the transfer sheet is drawn out from a state of the transfer sheet wound in a roll shape and pressed with the pressing member at the predetermined position, and a region where transfer has been completed is rewound in a roll shape downstream from the predetermined position in a transport direction. Further, it is preferable that during a steady-state operation, the pressing member performs only a reciprocating motion including moving from a predetermined stand-by position to a pressing position at which the pressing member presses the thin film against the pattern film formation surface of the substrate, and returning from the pressing position to the stand-by position. Further, it is preferable to include combinations each of which includes supply means for supplying the transfer sheet to a position where transfer of the thin film to the substrate is performed and a pressing member corresponding to the transfer sheet supplied by the supply means are arranged; and a discontinuous single substrate is transported in a direction of arrangement of the combinations, and transport of the substrate is stopped at a position corresponding to the pressing member, whereby pressing is performed with the pressing member. Furthermore, it is preferable that transfer positions for transferring thin films to substrates by pressing members in the combinations are arranged at equal intervals, the substrates are transported at intervals matched with the arrangement and simultaneously stopped at the transfer positions, and pressing is simultaneously performed with all the pressing members.

Further, according to a second aspect of the present invention, there is provided a pattern film forming apparatus for forming a predetermined pattern film on a surface of a substrate, including: sheet supply means which supplies a transfer sheet in which a thin film is formed by means of a vacuum film forming method on a surface of a sheet-shaped material to a predetermined transfer position; pressing means which has a pressing member with irregularities formed in accordance with the pattern film, and which presses one of the transfer sheet and the substrate with the pressing member to press the thin film against the substrate at the transfer position; and substrate transport means which supplies the substrate on which the pattern film is to be formed to the transfer position so that a pattern film formation surface is opposed to the thin film, and discharges the substrate from the transfer position after pressing.

In pattern film forming apparatus according to the second aspect of the invention, it is preferable to include heating means which heats a transfer portion when the pressing is performed with the pressing member. Further, it is preferable that the transfer sheet comprises a long sheet, and said sheet supply means includes a supply roller for placing a sheet roll around which the long transfer sheet is wound before use and a take-up roller for taking up the transfer sheet on which transfer has been completed. Further, it is preferable that said sheet supply means transports the long transfer sheet intermittently in a longitudinal direction, and said pressing means presses the thin film of the transfer sheet against the substrate with the pressing member when said sheet supply means stops transporting the transfer sheet. Further, it is preferable that during a steady-state operation of the pressing member, said pressing means performs only a reciprocating motion between a predetermined stand-by position and a pressing position at which said pressing means presses the thin film of the transfer sheet against the pattern film formation surface of the substrate. Further, it is preferable that said pressing means further comprises a roller that rotates while pressing one of the pressing member at the pressing position and the substrate at the transfer position against the transfer sheet. Furthe, it is preferable that combinations each of which includes said sheet supply means and said pressing means are arranged, and said substrate transport means transports a discontinuous single substrate in a direction of arrangement of the combinations. Further it is preferable that transfer positions for transferring thin films to substrates by pressing members in the combinations are arranged at equal intervals, said substrate transport means transports the substrates at intervals matched with the arrangement and simultaneously stops the substrates at the transfer positions, and furthermore, all said pressing means perform pressing with the pressing members simultaneously. Further, it is preferable which is compatible with formation of a pixel pattern in which pixels each having three sub-pixels are regularly arranged in a vertical direction and a horizontal direction and which includes first pressing means for forming a first sub-pixel, second pressing means for forming a second sub-pixel and third pressing means for forming a third sub-pixel. Further, it is preferable that each of said first pressing means, said second pressing means, and said third pressing means uses a pressing member having an identical uneven pattern, and said substrate transport means transports the substrate while the substrate is shifted with respect to the pressing member for the transfer position by an amount corresponding to each of the sub-pixels. Further, it is preferable that said sheet supply means intermittently transports the transfer sheet by an amount corresponding to each of the sub-pixels. Furthermore, it is preferable that the pressing member has a convex pattern formed continuously in a diagonal direction through shifting by one-third of a pixel in the horizontal direction and by one pixel in the vertical direction.

According to the present invention, a high-definition pattern film with sharp edge can be formed with high productivity, using a simple facility, without using a mask that must be washed and is difficult to handle. In addition, the pattern film material is not wasted, and the use efficiency of the material is high.

Furthermore, according to the present invention, the pattern film can be formed in a separate step. Therefore, the contamination in the apparatus due to a film formation material can be prevented, and even in the case where the heat resistance of a substrate in the apparatus on which the pattern film is to be formed and other members accompanying the substrate is low, a pattern film made of a desired material can be formed.

DESCRIPTION OF THE PREFERRED EMBODIMENTS

Figure 1:
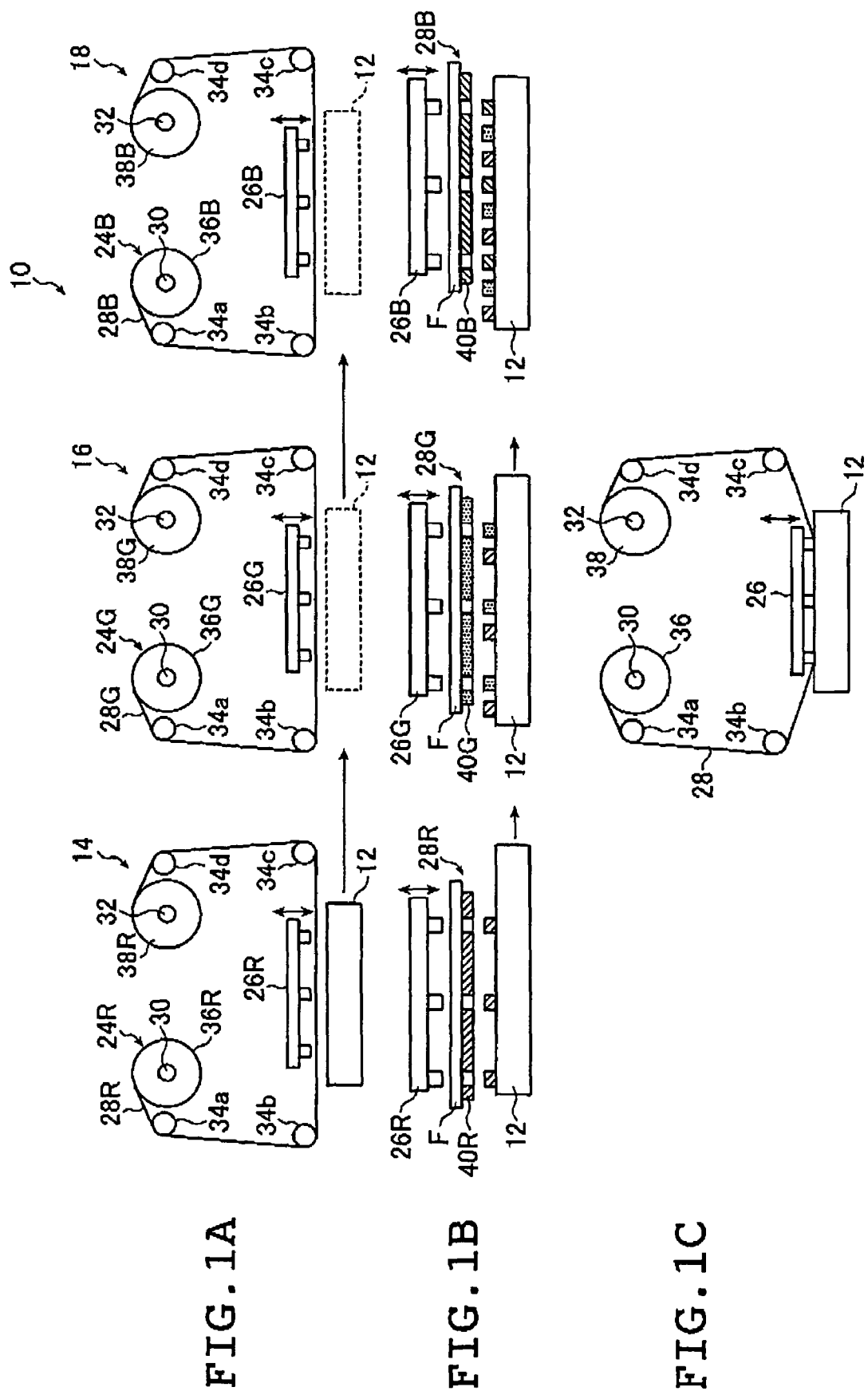
FIG. 1A is a conceptual diagram illustrating an embodiment of a pattern film forming apparatus of the present invention using a pattern film forming method of the present invention.
FIG. 1B is a partially enlarged view of the pattern film forming apparatus shown in FIG. 1A.
FIG. 1C is a conceptual diagram illustrating how the pattern film forming apparatus shown in FIG. 1A is operated.

Hereinafter, the pattern film forming method and the pattern film forming apparatus of the present invention will be described in detail by way of preferable embodiments shown in the attached drawings.

FIG. 1A is a conceptual diagram showing an embodiment of a pattern film forming apparatus of the present invention in which a pattern film is formed according to a pattern film forming method of the present invention.

A pattern film forming apparatus 10 (hereinafter, referred to as a film forming apparatus 10) shown in FIG. 1A is an apparatus for forming light-emitting layers of respective colors of R (red), G (green), and B (blue) on the surface of a substrate 12 on which the light-emitting layers are to be formed in the course of production of, for example, an organic EL element. The film forming apparatus 10 basically includes an R light-emitting layer forming part 14, a G light-emitting layer forming part 16, and a B light-emitting layer forming layer 18, and substrate transport means (not shown).

The film forming apparatus 10 forms an R light-emitting layer, a G light-emitting layer, and a B light-emitting layer that are pattern films made of respective light-emitting materials of R, G, and B on the surface of the substrate 12 through transfer from a transfer sheet 28 (described later).

In the illustrated case, the substrate 12 is, for example, made of a glass plate or the like with an anode layer, a hole injection layer, and a hole transport layer formed thereon. Alternatively, the substrate 12 may be made of a resin film or the like with a cathode layer, an electron injection layer, and an electron transport layer formed thereon. In the present invention, the substrate is not limited to a substrate on which an organic EL light-emitting layer is formed, and various members on which pattern films can be formed are applicable.

In the illustrated film forming apparatus 10, the substrate transport means transports the substrate 12 to a predetermined transfer position, and transports the substrate 12 with the pattern films formed (transferred) thereon downstream. In the present invention, the substrate transport means may be configured using known transport means for a sheet-shaped material and a plate-shaped material, such as transport means using a belt conveyor, transport means using a guide rail and a substrate holding member moving while being guided on the guide rail, and transport means using a transport roller group for transporting the substrate or a substrate holding member while the substrate or the substrate holding member is mounted thereon.

Furthermore, the substrate transport means may have means for aligning the substrate 12 at a transfer position described later, such as detection means for detecting the position of the substrate 12, in addition to the transport means.

In the illustrated film forming apparatus 10, as a preferable embodiment, each light-emitting layer forming part is disposed so that the intervals between transfer positions of pattern films onto the substrate 12 become equal; Furthermore, the substrate transport means continuously transports substrates 12 at the same intervals as the above-mentioned intervals. As will be described in detail later, a substrate with R, G, and B light-emitting layers formed thereon is produced at a time interval at which a pattern film is formed on (transferred to) the substrate 12 by one process and supplied to the subsequent step, whereby high productivity and production efficiency can be realized.

As described above, the film forming apparatus 10 includes the R light-emitting layer forming part 14, the G light-emitting layer forming part 16, and the B light-emitting layer forming part 18.

In the illustrated case, the R light-emitting layer forming part 14, the G light-emitting layer forming part 16, and the B light-emitting layer forming part 18 basically have the same configuration, except that light-emitting layers formed on the substrate 12 are different. Therefore, in the illustrated case, the same components are denoted by the same reference numerals, and regarding elements to be distinguished on the light-emitting layer forming part basis, R is given to reference numerals related to the R light-emitting layer forming part 14, G is given to reference numerals related to the G light-emitting layer forming part 16, and B is given to reference numerals related to the B light-emitting layer forming part 18. The description of individual elements will be made, if required.

The R light-emitting layer forming part 14 forms an R light-emitting layer on the surface of the substrate 12, and configured so as to include sheet supply means 24R and a pressing member 26R. The G light-emitting layer forming part 16 forms a G light-emitting layer on the surface of the substrate 12, and configured so as to include sheet supply means 24G and a pressing member 26G. Furthermore, the B light-emitting layer forming part 18 forms a B light-emitting layer on the surface of the substrate 12, and is configured so as to include sheet supply means 24B and a pressing member 26B.

In the film forming apparatus 10, as conceptually shown in FIG. 1B, first, in the R light-emitting layer forming part 14, the R light-emitting layer with a predetermined pattern to be an R pixel of an organic EL element is formed on the substrate 12 transported to a predetermined transfer position. Then, in the G light-emitting layer forming part 16, a G light-emitting layer with a predetermined pattern to be a G pixel of the organic EL element is formed on the substrate 12 transported to a predetermined transfer position. Furthermore, in the B light-emitting layer forming part 18, a B light-emitting layer with a predetermined pattern to be a B pixel of the organic EL element is formed on the substrate 12 transported to a predetermined transfer position. The substrate 12 with the respective R, G, and B light-emitting layers formed thereon is supplied to the subsequent step.

The sheet supply means 24 (24R, 24G, 24B) includes a transfer sheet 28 (28R, 28G, 28B), a supply roller 30, a take-up roller 32, and a guide roller 34 (34a, 34b, 34c, 34d).

The transfer sheet 28 is obtained by forming a thin film of an organic light-emitting material (hereinafter, referred to as a light-emitting material layer 40 (40R, 40G, 40B)) to be a light-emitting layer (R light-emitting layer, G light-emitting layer, B light-emitting layer) over the entire surface of a long base film F by means of a vacuum film forming method.

In the illustrated film forming apparatus 10, the light-emitting material layer 40 is formed on the base film F in a facility separate from the film forming apparatus 10. The transfer sheet 28 with the light-emitting material layer 40 formed thereon is supplied to the film forming apparatus 10 as a sheet roll 36 wound in a roll shape with the light-emitting material layer 40 facing outside, and is placed on the supply roller 30. More specifically, in the illustrated film forming apparatus 10, three kinds of R, G, and B sheet rolls 36 (36R, 36G, 36B) are formed, and are respectively placed in corresponding light-emitting layer forming parts.

The transfer sheet 28 is unwound from the sheet roll 36, guided by the guide rollers 34a, 34b, 34c, and 34d, and reach a winding shaft (not shown) placed on the take-up roller 32. A region of the transfer sheet 28 on which a light-emitting material has been transferred, is rewound in a roll shape around the winding shaft to form a collection roll 38 (38R, 38G, 38B).

Furthermore, the transfer sheet 28 is opposed to the pressing member 26 and the substrate 12 with the light-emitting material layer 40 facing the substrate 12 in a linear shape (flat shape) and with a predetermined tension, between the guide rollers 34b and 34c. As will be described in detail later, the transfer position is set in the opposed region. In this region, the transfer sheet 28 is pressed with the pressing member 26, whereby the light-emitting material layer 40, i.e., a pattern film is transferred from the region of the transfer sheet 28 corresponding to the transfer position to the substrate 12. Thus, a light-emitting layer that is a pattern film of a light-emitting material is formed on the surface of the substrate 12. This transfer will be described in detail later.

In the present invention, there is no particular limit to the base film F of the transfer sheet 28. More specifically, various known sheet-shaped materials such as resin films can be all used as the base film F, as long as they have strength sufficient for transfer of a light-emitting layer onto the substrate 12 described later, and sufficient heat resistance during film formation.

In the present invention, the surface property (surface roughness, surface state, etc.) of a light-emitting layer to be formed on the surface of the substrate 12 basically follows the surface property of the base film F. Thus, it is preferable that the base film F be appropriately selected in accordance with the surface property required in a light-emitting layer. That is, according to the present invention, the surface property of a pattern film can be controlled by the selection of the base film F.

Herein, in order to keep transfer property of the light-emitting material layer 40 (pattern film) onto the substrate 12 described later, such as sharpness of an edge of a pattern film (pixel), the base film F needs to follow the shape (convex portion) of the pressing member 26. More specifically, the property of the base film F largely influences the transfer property of a pattern film.

Therefore, it is preferable that the base film F be as thin as possible (preferably, 10 µm or less), if required strength can be kept. Furthermore, it is more preferable that the base film F have a lower modulus of elasticity and a higher elongation coefficient.

In the present invention, various kinds of film forming methods can be used as a method of forming the light-emitting material layer 40 (a material layer forming a pattern film) on the base film F as long as the method used is a vacuum film forming method.

More specifically, all the various kinds of vacuum film forming methods can be used, such as vacuum vapor deposition, sputtering, ion plating, and chemical vapor deposition (CVD). Furthermore, a film formation condition may be appropriately determined in accordance with the vacuum film forming method to be used, the composition and film thickness of a vacuum deposited thin film, and the like.

Furthermore, there is no particular limit to a light-emitting material layer to be formed, and various kinds of organic light-emitting materials (i.e., organic light-emitting materials of a low-molecular type), which can be formed by means of a vacuum film forming method, can be all used.

In the present invention, the organic light-emitting material is not the sole material for forming a thin film (hereinafter referred to as a transfer layer) to be formed on the transfer sheet 28 by means of a vacuum film forming method, i.e., a pattern film to be formed on the substrate, and all the thin films (low-molecular thin films) that can be formed by means of a vacuum film forming method can be used. Examples of the material for the pattern film include: a transparent conductive film such as indium tin oxide (ITO), zinc oxide, or titanium nitride; a magnetic film of a cobalt alloy, a chromium alloy, or the like; an oxide film of silicon oxide, titanium oxide, aluminum oxide, or the like; a nitride film of silicon nitride, boron nitride, or the like; a metal film of aluminum, zinc, nickel, chromium, titanium, or other metals; a carbonized film; a metal compound film; and an organic material film of an organic compound, an organic metal material, or the like. The film thickness of the pattern film may be determined in accordance with the application of the pattern film (substrate with a pattern film formed thereon).

Furthermore, if required, thin films may be formed on the transfer sheet 28 by means of a vacuum film forming method, and pattern films may be formed by one transfer operation using transfer layers.

As described above, in the illustrated film forming apparatus 10, the transfer sheet 28 for forming the light-emitting material layer 40 on the base film F is produced in a separate facility, and supplied to the film forming apparatus 10 in the state of the sheet roll 36 with the transfer sheet 28 wound therearound.

When vacuum film formation is performed in the step of forming a pattern film as in the conventional formation of a pattern film by means of vapor deposition with masking, in many cases, film formation is rate-determined, resulting in a decrease in productivity. Therefore, it is preferable that a film formation rate be increased. On the other hand, when the film formation rate is increased, there arises a problem in film quality such as the occurrence of material decomposition. Furthermore, when vacuum film formation is performed in a facility of forming a pattern film, a problem such as contamination of the surroundings due to a film formation material occurs.

In contrast, according to the present invention, as describe above, the light-emitting material layer 40 (transfer layer) can be formed in a separate step from that of forming a pattern film on the substrate 12 (transfer step described later) and in a separate facility. Therefore, vacuum film formation is not rate-determined during the pattern film formation step, whereby the light-emitting material layer can be formed under an optimum condition, and furthermore, the facility of forming a pattern film is not contaminated during film formation. Furthermore, the film formation step and the step of forming a pattern film can be performed separately. Therefore, the step of forming a pattern film is not adversely influenced by the heat during film formation. Furthermore, even when heating for the purpose of enhancing transfer property of a transfer layer is conducted, the heating at 100° C. or less suffices. Therefore, according to the present invention, the substrate 12, the pressing member 26, the base film F before transfer, and the like can be prevented from being adversely influenced by heat.

Furthermore, during vacuum film formation, degassing and the like can be performed, and it is sometimes preferable that the substrate and the like be heated during film formation, in terms of the property, strength, density, and the like of a film. Herein, according to the vapor-deposition method with masking, there is a problem such as mask expansion, so that the substrate and the like cannot be heated during film formation. In contrast, according to the present invention, if a material having heat resistance such as a heat-resistant film is used as the base film F, the substrate can be freely heated during film formation.

The light-emitting material layer 40 formed by means of a vacuum film forming method may be generally degraded through contact with air, and environmental management is often important. However, by winding the light-emitting material layer 40 in a roll shape as in the sheet roll 36, the light-emitting material layer 40 can be prevented from coming into contact with air. Furthermore, if required, a protective film may be wound around the sheet roll 36.

In the present invention, the transfer sheet 28 is pressed with the pressing member 26 from the reverse surface of the transfer sheet 28 (opposite surface to the light-emitting material layer 40), and the light-emitting material layer 40 is pressed against the substrate 12, whereby the light-emitting material layer 40 is adhered to the substrate 12, and the light-emitting material layer 40 is peeled off from the transfer sheet 28 to be transferred to the surface of the substrate 12.

Therefore, it is preferable that the light-emitting material layer 40 have satisfactory peeling property from the base film F. In order to realize this, it is preferable that, before the light-emitting material layer 40 is formed on the base film F, the film formation surface of the base film P be subjected to a treatment for imparting peeling property allowing the base film F to be peeled off from the light-emitting material layer 40 (hereinafter, referred to as a peeling treatment).

There is no particular limit to a method of the peeling treatment, and various kinds of methods can be used. Thus, as the peeling treatment, a method capable of obtaining an intended effect may be appropriately selected in accordance with the materials for the base film F and the light-emitting material layer 40 (i.e., a pattern film to be formed), the adhesion between the base film F and the light-emitting material layer 40, and the like.

A method is illustrated in which a peeling layer is formed on the surface of the base film F prior to the formation of the light-emitting material layer 40. Examples of the peeling layer include a silicone layer, a fluororesin layer, a wax layer, a water-soluble peeling layer, a water-repellent layer using fluororesin and silicone, and a layer made of an inactive material such as gold. Furthermore, the peeling layer may be formed by means of various kinds of methods such as: a method involving applying/drying a coating by means of dip coating, spin coating, or the like; a vacuum film forming method such as vacuum vapor deposition; and a method of forming a peeling layer by means of plasma polymerization.

Furthermore, the peeling treatment may also be performed by inactivating the surface of the base film F by means of a method involving forming a metal oxide film or a carbon film on the surface of the base film F prior to the formation of the light-emitting material layer 40, a method involving performing a plasma treatment such as corona discharge on the surface of the base film F in vacuum or in the air, and the like.

Furthermore, in the vacuum film formation, a film that is more likely to be peeled can be formed as the kinetic energy during film formation is lower. Therefore, the peeling treatment may be performed as follows: at the time of start of film formation, a film is formed with low energy to form an underlying layer for peeling on the surface of the base film F, and thereafter, a film is formed with energy in accordance with an intended film.

In particular, a method involving forming a water-repellent layer as a peeling layer on the surface of the base film F is preferable. It is particularly preferable to form a water-repellent layer at a water contact angle of 100° to 130°.

The transfer sheet 28 may be transported from the sheet roll 36 to the collection roll 38 by means of known transport means in a long sheet shape.

Various kinds of transport patterns for the transfer sheet 28 can be used, as long as the light-emitting material layer 40 is allowed to be present over the entire region in accordance with the convex portions of the pressing member 26 in accordance with a pattern film to be formed.

For example, as described above, the illustrated film forming apparatus 10 forms a light-emitting layer of an organic EL display for performing color image display of R, G, and B. As a preferable method in which the use efficiency of a light-emitting material is highest, there is a method involving repeating a pattern in which transfer is performed with the pressing member 26, the transfer sheet 28 is transported by a length corresponding to one-third of a pixel of the light-emitting layer (one sub-pixel), transfer is performed at this position, then, the transfer sheet 28 is transported again by the length corresponding to one-third of a pixel, transfer is performed at this position, and the transfer sheet 28 is transported by the length corresponding to one substrate 12. Alternatively, in order to keep the stability of formation of a pattern film, the following pattern may be performed: transport/transfer is performed twice for a half-pixel after transfer, and transport by a length corresponding to one substrate is performed.

In this case, since the transfer sheet 28 has a sufficient space for the transfer of the sub-pixels, the positional precision of the transfer sheet 28 is not required to be so high.

The pressing member 26 is a plate-shaped member having an uneven pattern in which portions corresponding to a light-emitting layer to be formed on the substrate 12 are convex, in accordance with the pattern (pixel pattern of each color) of the light-emitting layer. In the illustrated example, the pressing member 26 is placed parallel to the transfer sheet 28 so as to correspond to a predetermined transfer position set between the guide rollers 34b and 34c with the surface having the convex portions (hereinafter, referred to as a pressing surface) opposed to the transfer sheet 28.

Although not shown, in each forming part, moving means for the pressing member 26 is placed, which reciprocates the pressing member 26 to press the transfer sheet 28 against the substrate 12 placed at a predetermined transfer position from a predetermined stand-by position away from the transfer sheet 28, and returns the pressing member 26 to the stand-by position. The pressing member 26 performs only this reciprocating motion in a steady-state operation. For example, various known means such as means using an actuator and mechanical movement means may be used as the moving means.

In the film forming apparatus 10 of the present invention, the pattern of the convex portions of the pressing member 26 may be determined appropriately in accordance with the pattern film to be formed.

The illustrated film forming apparatus 10 forms a light-emitting layer of an organic EL element, for example. Therefore, the pressing member 26 may have convex portions corresponding to a pixel arrangement of each color in which a pixel column in a vertical (V) direction is arranged in a horizontal (H) direction at intervals of one pixel, for example, as in the organic EL element disposed in a general organic EL display. Furthermore, out of the convex portions of the pressing member 26 in each light-emitting layer forming part on the substrate 12, the convex portions with the same pattern are positioned so as to be shifted by one-third of a pixel (one sub-pixel). Thus, the same pressing member 26 is used in all the light-emitting layer forming parts, and the convex portions may be arranged so as to be shifted by one-third of a pixel with respect to a transfer position (substrate 12) in accordance with a pixel position of each color. Alternatively, each light-emitting layer may be formed by setting the pressing member 26 in the same way as the above, and shifting the transfer position (stop position of the substrate 12 during transfer) from the pressing member 26 by one-third of a pixel.

In the present invention, it is preferable that the convex portions (thin films) independent of each other be apart from each other as much as possible in terms of the transfer property of a pattern film, the sharpness of an edge portion of the pattern film, the support for a higher-definition pattern, and the like.

Figure 2:
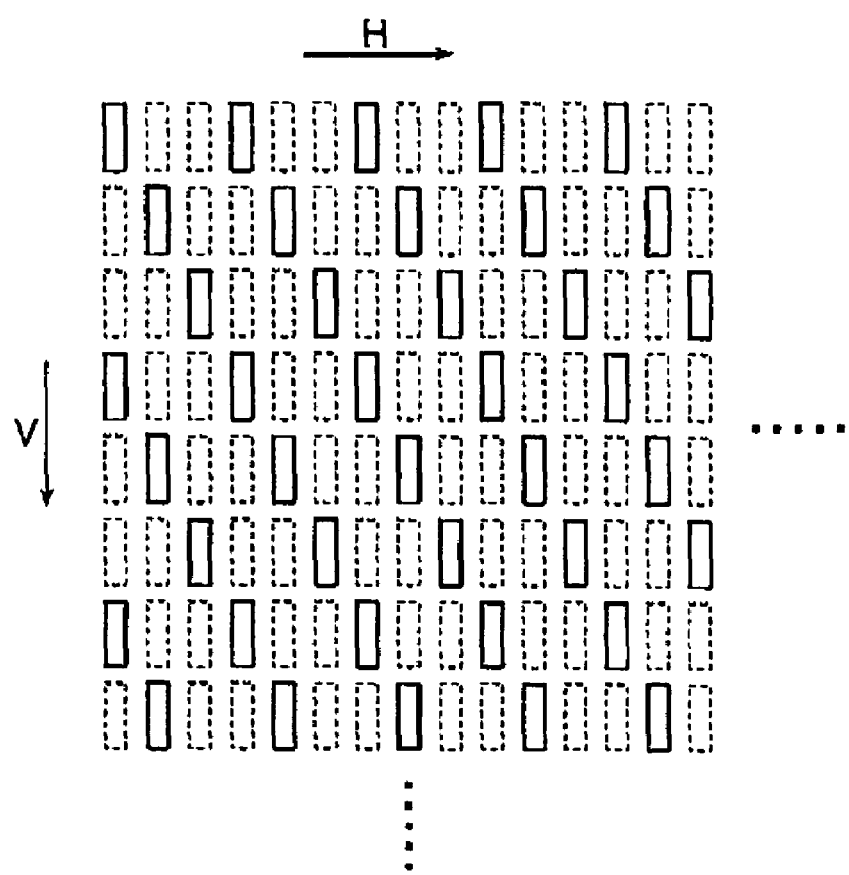
FIG. 2 is a conceptual diagram illustrating an example of a formation pattern of convex portions of a pressing member used in the present invention.

In view of the above-mentioned point, in the case where three kinds of different pattern films are formed with the same pattern as in the light-emitting layer of an organic EL in the illustrated example, it is advantageous that, by using the pressing member 26 having a pattern of convex portions with an arrangement in a diagonal direction such as a continuous arrangement in which convex portions are arranged so as to be shifted by one-third of a pixel in a horizontal (H) direction and by one pixel in a vertical (V) direction, for example, as shown in FIG. 2, a light-emitting layer having a pixel pattern corresponding to the pattern of the convex portions is formed.

In the present invention, there is no particular limit to the height of the convex portions (depth of irregularities) of the pressing member 26, and the height capable of transferring the light-emitting material layer of the transfer sheet 28 may be appropriately determined. In terms of the transfer property and the like, the convex portions have advantageously a greater height as long as sufficient strength is obtained, and are preferably 5 to 20 μm in height.

When the light-emitting layer of the organic EL element as in the illustrated case is formed, partition walls for partitioning pixels are present on the surface of the substrate 12. In the case where an obstacle for hindering the pressing with the pressing member 26 is present on the surface of the substrate 12, the convex portions of the pressing member 26 need be set higher than the obstacle.

There is no particular limit to the material for forming the pressing member 26, and various kinds of materials can be used as long as they provide sufficient strength. For example, various kinds of metal materials, ceramics materials, resin materials, glass, films, and the like may be used. Of those, glass is preferable in terms of the following: the pressing member 26 is obtained, which can form a high-precision pattern film since high-precision irregularities can be formed by etching, and which has a satisfactory pattern state in terms of edge property or a shape, and excellent surface flatness.

There is also no particular limit to the method of forming convex portions (irregularities) of the pressing surface of the pressing member 26, and various kinds of drawing processing methods in accordance with a material for forming the pressing member 26, a pattern film to be formed, and the like can be used. Examples of the processing method include: mechanical processing; processing by photolithography and etching used in the production of a semiconductor apparatus; and processing by electroforming. According to those processing methods, a minute pattern comparable to that obtained by photolithography can be formed with high size precision. Therefore, a high-precision and high-definition pattern film comparable to that obtained by photolithography can be formed.

In the film forming apparatus 10, when the substrate 12 is transported to a predetermined transfer position (position at which the substrate 12 is opposed to the pressing member 26), the pressing member 26 is lowered by the moving means from the stand-by position (state shown in FIG. 1A) apart from the transfer sheet 28 in the state in which the transfer sheet 28 stops.

In this way, as shown in FIG. 1C, the transfer sheet 28 is pressed from the reverse surface (base film F) by the pressing surface of the pressing member 26 to bring the light-emitting material layer 40 into contact with the surface of the substrate 12 on which a light-emitting layer is to be formed, thereby laminating the transfer sheet 28 and the substrate 12 together. Furthermore, the transfer sheet 28 (i.e., the light-emitting material layer 40) is pressed against the substrate 12 by the pressing member 26. Because of this pressing (or additional heating), the light-emitting material layer 40 in a region of the convex portions of the pressing member 26 is pressed strongly against the substrate 12, whereby the light-emitting material layer 40 is adhered to the substrate 12 by this pressing force.

After the light-emitting material layer 40 is pressed against the substrate 12 for a predetermined period of time, the pressing member 26 is raised to return to the stand-by position. As shown in FIG. 1A, the transfer sheet 28 is thus apart from the substrate 12. At this time, the light-emitting material layer 40 in portions corresponding to the convex portions of the pressing member 26 to be adhered to the substrate 12 is peeled from the base film F, and transferred to the substrate 12, whereby a light-emitting layer (i.e., a pattern film) is formed on the surface of the substrate 12, as shown in FIG. 1B.

When transfer is completed, the substrate 12 is transported downstream, and the transfer sheet 28 is transported by a predetermined amount (for example corresponding to one-third of a pixel or one substrate as described above). When the subsequent substrate 12 is transported to the transfer position, transfer of the light-emitting material layer 40 is performed similarly, whereby a light-emitting layer is formed on the surface of the substrate 12.

In peeling transfer of the light-emitting material layer 40 (transfer layer) from the transfer sheet 28 to the substrate 12, the pressing force and the pressing time by the pressing member 26 are not particularly limited. Thus, the pressure and the time capable of exact transfer may be appropriately determined in accordance with the adhesion between the light-emitting material layer 40 and the base film F, the attachment force between the light-emitting material layer 40 and the substrate 12, the thickness of the light-emitting material layer 40, the pattern of a light-emitting layer to be transferred, the size of the substrate 12, and the like.

During pressing, in order to enhance transfer property, a transfer portion may be heated by heating the pressing member 26 or the like. Furthermore, a transfer portion may be heated by heating the transfer sheet 28, the substrate 12, and the like, if possible in terms of heat resistance and the like. Furthermore, the number of members to be heated is not limited to one. The heating temperature of 100° C. or lower suffices, and the heating may be realized by a known method.

In the present invention, prior to the transfer of the pattern film onto the substrate 12, a treatment for enhancing the adhesion between the substrate 12 and the light-emitting material layer 40 (transfer layer) (hereinafter, referred to as an adhesion treatment) may be performed.

There is no particular limit to the adhesion treatment. Various kinds of methods can be used as long as they do not influence the quality of a product. Examples of the adhesion treatment include: a method involving activating the surface of the substrate 12 by means of a surface treatment such as irradiation with electron beams, ozone treatment, corona discharge, or glow discharge; and a method involving roughening the surface of the substrate 12 as exemplified by FIGS, 4A-4B, elements 46R, 46G, 46B and 48R, 48G, 48B, respectively. Furthermore, an adhesive layer may be formed on the surface of the substrate 12, as long as it does not influence the quality of a product to be produced.

As described above, according to the present invention, using a transfer sheet obtained by forming a thin film of a pattern film formation material by means of a vacuum film forming method, the thin film of the pattern film formation material is pressed against the substrate from the reverse surface of the transfer sheet or the substrate with the pressing member having convex portions corresponding to a pattern film to be formed, in the state in which the thin film of the pattern film formation material is in contact with the substrate, whereby a pattern film is formed. As is apparent from the above description, according to the present invention, by repeating simple operations including transport of the transfer sheet and the substrate, and pressing with the pressing member, without using a mask, an intended pattern film can be formed with high productivity. In particular, the film formation time is not rate-determined, which is advantageous in terms of the productivity. Furthermore, as described above, a pattern film can be formed easily on a large substrate by repeating the transfer while the substrate is moved. A pattern film can be thus formed in a larger area very easily as compared to that formed by using a mask.

Furthermore, the film formation material does not spread out when a pattern film is formed by a transfer process. Therefore, a pattern film with a much sharper edge can be formed compared with a pattern film using a mask.

Furthermore, according to the present invention, unlike the method disclosed in the above-mentioned JP 2003-173870 A and JP 2918037 B, a film is not formed directly on the pressing member (transfer member). Therefore, according to the present invention, a material layer is not formed in concave portions of the pressing member which have nothing to do with the formation of a pattern film, and the material for the pattern film is not wasted.

In particular, in the case where a regularly repeated pattern film is formed as in the organic EL light-emitting layer in the illustrated case, by transporting (moving) the transfer sheet in accordance With the regularity (gaps in the pattern), a material layer covering at maximum substantially the entire surface of the transfer sheet 28 can be used, and the use efficiency of material is very high. An organic material for an organic EL element is very expensive. Therefore, in view of the above points, the present invention is very advantageous and effective for forming a pattern film for an organic EL element.

Furthermore, once the pressing member 26 is positioned, the pressing member 26 need only perform a reciprocating motion between the stand-by position away from the transfer sheet 28 and the pressing position. On the other hand, if a transfer material layer is present over the entire region (all the positions corresponding to the convex portions of the pressing member 26 for the subsequent transfer) to be transferred next, appropriate transfer (formation of a pattern film) can be performed for the transfer sheet 28. Therefore, according to the present invention, it is not required to perform positioning with particularly high precision (control of a transport stop position) in order to form a pattern film.

More specifically, according to the present invention, only the substrate 12 must be positioned with high precision, so that the operation control, positional precision control, simplification of a facility, and the like can be achieved. Furthermore, in a configuration in which film forming parts are arranged in one direction, and the substrate 12 is transported in this arrangement direction as in the illustrated film forming apparatus 10, even in the case where transfer is repeatedly performed, once the substrate 12 is positioned in a direction orthogonal to the transport direction, the positioning of the substrate 12 in the subsequent processes is set only in the transport direction.

Furthermore, since the pressing member 26 and the material for forming a pattern film do not come into direct contact with each other, it is not necessary to wash the pressing member 26, and the frequency of maintenance may be very low. Thus, in the apparatus of the present invention, a preparatory pressing member 26 is not required, and an exchange mechanism and the like are not required.

Furthermore, as described above, the step of forming a film of a transfer material and the step of forming a pattern film on the substrate 12, i.e., the step of transferring a pattern film can be performed separately. Therefore, the facility for forming a pattern film is not contaminated during film formation, and a substrate and the like are not degraded owing to the heat during film formation. Thus, the degradation of a product such as an organic EL element resulting from such contamination of a facility and degradation of a substrate does not occur.

Furthermore, in the case where a substrate size is large, for example, a mechanism for moving a substrate is added to move the substrate, so that transfer is repeatedly performed. As a result, a pattern film can be formed over the entire surface of a substrate easily. More specifically, the same apparatus can be used for substrates with various sizes.

Even in this case, only the positioning of the substrate requires precision. The pressing member need only perform a predetermined reciprocating motion, and the requisite precision for the transport of the transfer sheet is not so high.

As described above, JP 2003-139944 A discloses the formation of a multi-color pattern sheet by laminating a transfer sheet and a substrate together, and pressing the laminate with a pressing member having irregularities corresponding to a pattern film, thereby transferring the pattern film to the substrate.

As described above, according to the pattern film forming method of the present invention, a thin film is formed on the base film by means of vacuum film formation, and the thin film formed by means of the vacuum film formation is transferred from the base film to the substrate, whereby a pattern film is formed on the substrate. In contrast, according to the method disclosed in JP 2003-139944 A, a coating film made of ink (coating) prepared by melting a high-polymer light-emitting material and a binder in an organic solvent is formed on a base film, and the coating film is transferred from the base film to the substrate, whereby a pattern film is formed. There is a difference in functional effect as described below between those methods.

In the formation of a pattern film in which the pattern film is transferred to a substrate by pressing from the reverse surface of a transfer sheet as disclosed in the present invention and JP 2003-139944 A, it is needless to say that the film has preferably a higher peeling property with which the film can be peeled off from the base film F to thereby keep satisfactory transfer property.

Therefore, according to the present invention, it is preferable that the light-emitting material layer 40 be formed by subjecting the surface of the base film F to a peeling treatment as described above.

However, such a peeling treatment, in particular, the formation of a water-repellent layer that is a preferable peeling treatment greatly reduces the wettability of a liquid in most cases. Therefore, in the case of forming a thin film by applying coating (ink) as in the method disclosed in JP 2003-139944 A, when a peeling treatment is performed, the wettability between the base film F and the ink degrades. Owing to the degradation of the wettability, it becomes impossible to form an appropriate coating film. More specifically, when a thin film is formed of coating, it is difficult to perform a peeling treatment, so that the enhancement of the peeling property by the peeling treatment is very difficult. Furthermore, such a coating film contains a binder, so that the adhesion thereof with respect to the base film is very strong, and the peeling property thereof is poor. More specifically, according to the method involving transferring a coating film as disclosed in JP 2003-139944 A, the peeling property is basically poor, and it is also difficult to conduct a peeling treatment. Therefore, a film is not peeled off appropriately from the base film in most cases, and a fine and high-precision pattern film is difficult to form stably with high productivity.

In contrast, the thin film formed by means of a vacuum film forming method as in the present invention has a satisfactory transfer property by pressing or heating, with the adhesion to the base film being kept at a required and sufficient level. In addition, the formation of a transfer film is not hindered by the peeling treatment. Therefore, the peeling treatment can be performed arbitrarily. More specifically, according to the present invention using a vacuum deposited thin film, a fine and high-precision pattern film can be formed stably with high productivity, using a thin film having satisfactory peeling property. Furthermore, by selecting the material for a peeling layer, the condition for imparting peeling property, the condition for transfer, and the like so that a peeling layer is not transferred simultaneously when a pattern film is transferred, an undesired substance can be prevented from adhering to the pattern film, and the peeling property can be maintained. Therefore, the peeling layer can be used repeatedly, which is advantageous in terms of the cost, productivity, and the like.

Furthermore, in order to form a pattern film with a sharp edge and high precision, the cutting property of a transfer film is important, and it is important that a thin film in a portion where the thin film is pressed by the convex portions of the pressing member be cut appropriately away from the periphery of the thin film and be transferred.

However, the coating film contains a binder as described above, so that the binding force in the film is strong. Furthermore, the coating film has toughness, so that a strong force is required for cutting the film. Therefore, it is difficult to stably cut such a coating film appropriately in accordance with the shape of the convex portions of the pressing member, and the film obtained by transfer has very often a shape different from that of the convex portions. Furthermore, since the coating film contains a large amount of components other than the functional components such as the binder, the coating film must have a certain thickness in order to form a film appropriately exhibiting the function. However, irrespective of the film type, the thicker the film used is, the stronger the binding force in the film is. Therefore, in the coating film, cutting property is degraded and the defects caused by the poor cutting property are further increased.

In contrast, a vacuum deposited thin film has required and sufficient film strength, and the binding force in the film is less strong than a resin coating film. Furthermore, the vacuum deposited thin film is less tough than the resin coating film. Therefore, by applying a pressing force with the convex portions, the film is cut relatively easily in accordance with the convex portions. Furthermore, the vacuum deposited thin film hardly contains a component other than a functional material, so that the thickness of the film can be decreased greatly compared with the resin coating film. Owing to those synergistic effects, a vacuum deposited thin film which has a shape appropriately conforming to the shape of the convex portions of the pressing member 26 can be transferred, and a high-definition pattern film can be formed with high precision.

Furthermore, depending upon the application and the like, in some cases, it is preferable that a pattern film have a multi-layered structure. According to the present invention using a vacuum film forming method, vacuum film formation is repeatedly performed in accordance with a multi-layered film to be formed, and a transfer layer made of a multi-layered film is formed on the base film easily, whereby a multi-layered pattern film can be formed on the substrate by one transfer operation.

However, in the case of producing a multi-layered film with the coating film, a subsequent layer cannot be applied until a precedent layer is dried completely, so that a long period of time is required for forming a multi-layered film. Furthermore, since the coating contains a solvent, when the coating is applied to a coating film previously-formed, the previous coating film is dissolved and the coatings in the interface are mixed, with the result that the function of each layer degrades.

Hereinafter, the operation of the film forming apparatus 10 shown in FIG. 1 will be described.

As described above, the substrate transport means (not shown) transports the substrate 12 in a predetermined path. The substrate transport means first stops at the transfer position of the R light-emitting layer forming part 14. If the transport of the transfer film 28R has been completed in this state, in the R Light-emitting layer forming part 14, the pressing member 26R at the predetermined position is lowered to press down the transfer film 28R, thereby pressing the transfer film 28R (i.e., the light-emitting material layer 40R) against the substrate 12. Then, the pressing member 26R is raised to the predetermined position after a predetermined period of time has passed.

Consequently, as shown on the left side of FIG. 1B, the light-emitting material layer 40R is peeled off and transferred to the substrate 12, whereby an R light-emitting layer is formed on the surface of the substrate 12.

When the formation of the R light-emitting layer has been completed, the substrate transport means transports the substrate 12 to the transfer position of the G light-emitting layer forming part 16. Furthermore, in the R light-emitting layer forming part 14, the transfer sheet 28R is transported by a predetermined amount, the unused transfer sheet 28R is unwound from the sheet roll 36R by the corresponding amount, and the used transfer sheet 28R is taken up around the collection roll 38R.

As described above, the transport amount of the transfer sheet 28 corresponds to one-third of a pixel of the organic EL element or one substrate 12 when three transfer operations are performed.

In the G light-emitting layer forming part 16, the substrate 12 is transported to a predetermined position as in the above. When the transport of the transfer film 28G has been completed, the pressing member 26G is lowered to press the transfer sheet 28G against the substrate 12. Then, the pressing member 26G is raised, and the light-emitting material layer 40G is peeled off and transferred to the substrate 12 as shown in the center part of FIG. 1B, whereby a G light-emitting layer is formed on the surface of the substrate 12.

Then, the substrate transport means similarly transports the substrate 12 to the transfer position of the B light-emitting layer forming part 18. In the G light-emitting layer forming part 16, the substrate transport means transports the transfer sheet 28G by a predetermined amount, and the transfer sheet 28 is unwound from the sheet roll 36G and taken up around the collection roll 38G.

Furthermore, in the B light-emitting layer forming part 18, the substrate 12 is similarly transported to the transfer position. When the transport of the transfer film 28B has been completed, the pressing member 26B is lowered/raised to peel off the light-emitting material layer 40B, which is then transferred to the substrate 12 as shown on the right side of FIG. 1B, whereby a B light-emitting layer is formed on the surface of the substrate 12. Then, the substrate transport means supplies the substrate 12 with the respective R, G, and B light-emitting layers formed thereon (i.e., a light-emitting plate having an organic EL element) to the subsequent step. In the B light-emitting layer forming part 18, the transfer sheet 28B is transported by a predetermined amount.

Herein, in the illustrated film forming apparatus 10, the R light-emitting layer forming part 14, the G light-emitting layer forming part 16, and the B light-emitting layer forming part 18 have the transfer positions placed at equal intervals. Furthermore, a number of the substrates 12 are transported by the substrate transport means so that the substrates are arranged at the same intervals as those between the transfer positions. Therefore, in the film forming apparatus 10 in the state in which the apparatus is steadily moved, the substrates 12 are simultaneously supplied to the transfer positions of all the light-emitting layer forming parts, and the pressing with the pressing member 26 (i.e., the transfer of the light-emitting layer) is simultaneously performed, whereby the substrates having light-emitting layers formed thereon can be supplied downstream.

Thus, according to the illustrated film forming apparatus 10, in the step of producing an organic EL element, a light-emitting plate with light-emitting layers of three colors of R, G, and B formed thereon can be produced at a time period at which a light-emitting layer for one color is formed, so that the very high productivity and production efficiency can be realized. Furthermore, according to the present invention, a production method with very high production efficiency and productivity can be realized, in which regarding the formation of each light-emitting layer, vacuum film formation and the like are not rate-determined, and each light-emitting layer can be formed only by the transport of the substrate 12 and the transfer sheet 28, and pressing with the pressing member 26. Therefore, according to the present invention, owing to the synergistic effects, a light-emitting plate of an organic EL element can be produced with very satisfactory productivity and production efficiency.

The pattern film forming method and pattern film forming apparatus of the present invention have been described in detail. The present invention is not limited to the above embodiment. Needless to say, various kinds of alterations and modifications may be made departing from the scope and spirit of the present invention.

For example, the illustrated film forming apparatus 10 forms a pattern film on a discrete (single) substrate 12. However, the present invention is not limited thereto. A pattern film may be formed on the surface of a substrate made of a web-shaped material such as a long sheet-shaped material.

Furthermore, in this case, for example, by using a pressing member composed of a member in an endless belt shape having irregularities corresponding to a pattern film on the outer surface and a roller for pressing the member against the substrate from the inner surface, pattern films may be formed continuously on the surface of the long substrate.

Alternatively, the transfer sheet is not limited to the long one. A pattern film may be formed on a substrate by using a discrete transfer sheet.

Furthermore, in the illustrated film forming apparatus 10, by pressing the transfer sheet 28 from the reverse surface thereof with the pressing member 26, a pattern film is transferred to the substrate 12. However, the present invention is not limited thereto. A pattern film may be transferred to the substrate by pressing from the reverse surface (pattern film formation surface) of the substrate with the pressing member.

Figure 3:
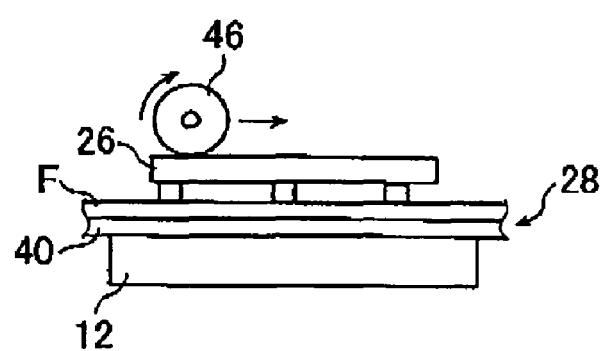
FIG. 3 is a conceptual diagram of another embodiment of the pattern film forming method of the present invention.
Figure 4A:
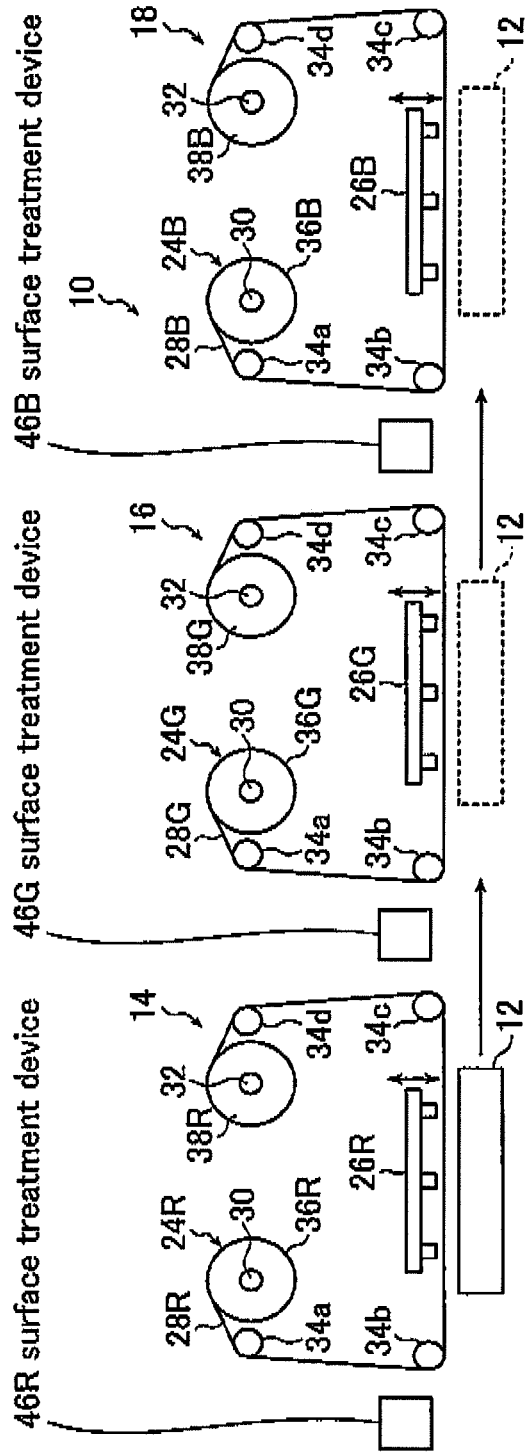
FIGS. 4A-4B illustrate additional features of the pattern film forming apparatus.
Figure 4B:
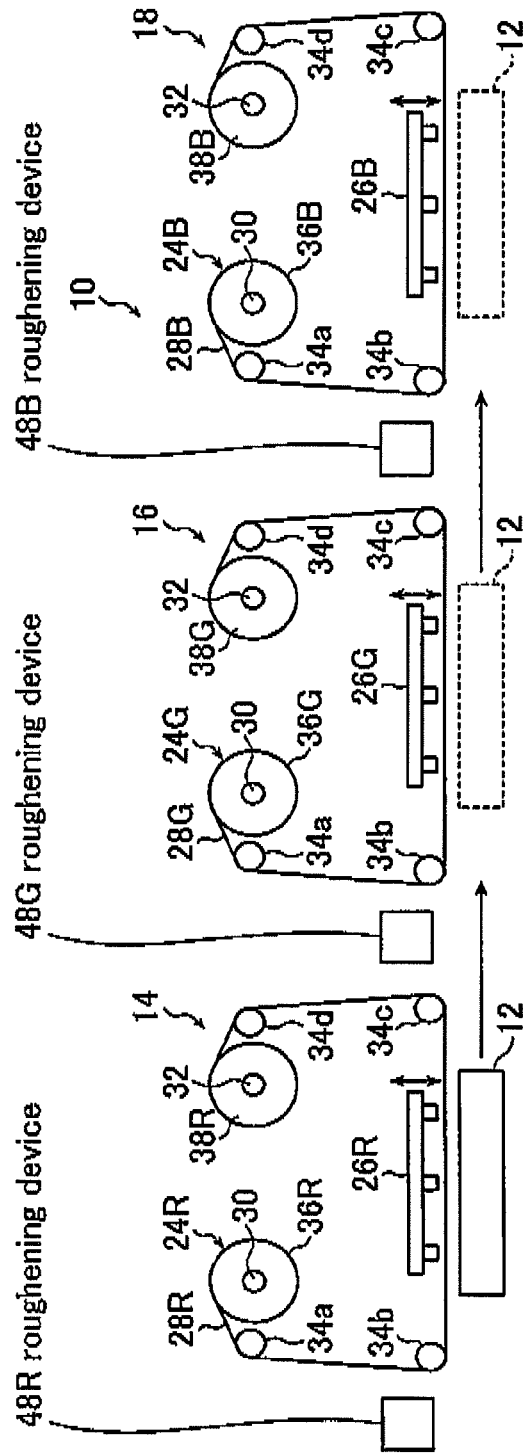

Furthermore, the present invention is not limited to a method involving directly pressing with the pressing member 26 or the substrate as in the illustrate example. For example, as schematically shown in FIG. 3, the transfer sheet 28 may be pressed with the pressing member 26 by pressing the pressing member 26 from the reverse surface side using a pressing roll 46. Alternatively, the substrate may be pressed from the reverse surface with a pressing roll. This method is advantageous in terms of the easiness of applying a uniform pressure, product quality, and the like in the case of the substrate 12 of large size.

EXAMPLE

Hereinafter, the present invention will be described in more-detail by way of a specific example.

A transparent conductive film (ITO film) with a thickness of about 200 nm was formed on the entire surface of a glass plate (25×25 mm) by means of DC sputtering. The film formation was performed at an ultimate degree of vacuum of 1×10$^{-3}$ Pa, a film formation pressure of 0.5 Pa, a substrate temperature of 250° C., and a film formation speed of 1 nm/sec.

An aluminum lead was connected to the transparent electrode film thus obtained, and furthermore, a copper phthalocyanine layer with a thickness of about 10 nm was formed on the transparent electrode film by means of vacuum vapor deposition. The film formation was performed at an ultimate degree of vacuum of 5×10$^{-4}$ Pa and a film formation speed of 0.4 nm/sec.

Furthermore, an α-NPD (α-N,N'-dinaphthyl-N,N'-diphenyl benzidine) layer with a thickness of about 40 nm was formed on the copper phthalocyanine layer by means of vacuum vapor deposition, whereby a transparent electrode plate was produced. The film formation was performed at an end-point vacuum degree of 5×10$^{-4}$ Pa and a film formation speed of 0.4 nm/sec.

In a center portion (15×15 mm) on the surface of a glass plate (25×25 mm), an uneven pattern in which convex portions each having a size of 100×100 μm and a height (depth of irregularities) of 10 μm were formed at intervals of 50 μm in a lattice shape, was formed to obtain a pressing member.

On the other hand, a water-repellent layer was formed on the surface of an aramid film (thickness: 4 μm). A low-molecular red light-emitting material for the R light-emitting layer was formed in thickness of about 55 nm on the water-repellent layer by means of vacuum vapor deposition, whereby a transfer sheet with the R light-emitting layer formed on the surface of a base film was obtained. Used as the low-molecular red light-emitting material was a material obtained by doping Alq3 (represented by the formula shown below) with 1wt% of DCM (4-dicyanomethylene-2-methyl-6-(p-dimethylaminostyryl)-4H-pyran). Furthermore, the film formation was performed at an ultimate degree of vacuum of 5×10$^{-4}$ Pa and a film formation speed of 0.4 nm/sec.

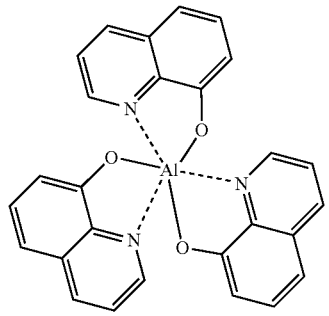

The transparent electrode substrate and the transfer sheet were laminated together so that the α-NPD came into contact with the light-emitting material layer. Then, the uneven surface of the pressing member was brought into contact with the reverse surface of the transfer sheet, and the laminate was pressed with the pressing member at a temperature of 90° C. and a pressure of 0.3 MPa for 10 seconds. Then, the transfer sheet was peeled off from the transparent electrode substrate to transfer the light-emitting material layer from the transfer sheet to the transparent electrode plate, whereby an R light-emitting layer was formed on the surface of the transparent electrode plate.

The surface of the R light-emitting layer thus obtained was irradiated with UV-light and was observed with a fluorescence microscope (VB-6000, produced by KEYENCE) (at magnifications of 25× to 170×). Consequently, the light-emitting layer was transferred over the entire area of all the pixels, the edge of each pixel was sharp, and no defects were observed.

An organic thin film layer made of the Alq3 (thickness: about 15 nm) was formed on the thus formed R light-emitting layer by means of vacuum vapor deposition. The film formation was performed at an ultimate degree of vacuum of 5×10$^{-4}$ Pa and a film formation speed of 0.4 nm/sec.

A LiF layer (thickness: about 1.5 nm) was formed on the organic thin film layer by means of vacuum vapor deposition. The film formation was performed at an ultimate degree of vacuum of 5×10$^{-4}$ Pa and a film formation speed of 0.1 nm/sec.

An aluminum layer (thickness: about 250 nm) serving as a cathode was formed on the LiF layer by means of vacuum vapor deposition. The film formation was performed at an ultimate degree of vacuum of 5×10$^{-4}$ Pa and a film formation speed of 5 nm/sec.

Furthermore, an aluminum lead was connected to the aluminum layer, whereby an organic EL element emitting R-light was produced.

The organic EL element thus produced was supplied with a DC current using a source major unit 2400 (produced by KEITHLEY) to emit light, and the light-emission state of each pixel was observed with a microscope (at magnifications of 25× to 170×). Consequently, the entire area of all the pixels emitted light, the brightness was uniform (100 cd or more) over the entire area, the edge of each pixel was sharp, and no defects were observed.

The effects of the present invention are apparent from the above-mentioned results.

What is claimed is:

1. A pattern film forming apparatus for forming a predetermined pattern film on a surface of a substrate, comprising:

sheet supply means which supplies a transfer sheet on which a thin film is formed by means of a vacuum film forming method on a surface of a sheet-shaped material to a predetermined transfer position;

pressing means which has a pressing member with irregularities formed in accordance with the pattern film, and which presses one of the transfer sheet and the substrate with the pressing member to press the thin film against the substrate at the transfer position; and substrate transport means which supplies the substrate on which the pattern film is to be formed to the transfer position so that a pattern film formation surface is opposed to the thin film, and discharges the substrate from the transfer position after pressing, and wherein said pressing member presses the thin film against the substrate from one of a reverse surface of the transfer sheet opposite to the thin film and a reverse surface of the substrate opposite to the pattern film formation surface to transfer the thin film to the substrate and to peel the thin film from the transfer sheet, wherein said pattern film has a regularly repeated pattern, and wherein said pressing member has regularly repeated irregularities in accordance with the pattern film, and further comprising a surface treatment device disposed upstream of the pressing means to activate the surface of the substrate to the pattern film formation surface.

2. The pattern film forming apparatus according to claim 1, further comprising heating means which heats a transfer portion when the pressing is performed with the pressing member.

3. The pattern film forming apparatus according to claim 1, wherein the transfer sheet comprises a long sheet, and said sheet supply means includes a supply roller for placing a sheet roll around which the long transfer sheet is wound before use and a take-up roller for taking up the transfer sheet on which transfer has been completed.

4. The pattern film forming apparatus according to claim 3, wherein said sheet supply means transports the long transfer sheet intermittently in a longitudinal direction, and said pressing means presses the thin film of the transfer sheet against the substrate with the pressing member when said sheet supply means stops transporting the transfer sheet.

5. The pattern film forming apparatus according to claim 1, wherein during a steady-state operation of the pressing member, said pressing means performs only a reciprocating motion between a predetermined stand-by position and a pressing position at which said pressing means presses the thin film of the transfer sheet against the pattern film formation surface of the substrate.

6. The pattern film forming apparatus according to claim 1, wherein combinations each of which includes said sheet supply means and said pressing means are arranged, and said substrate transport means transports a discontinuous single substrate in a direction of arrangement of the combinations.

7. The pattern film forming apparatus according to claim 6, wherein transfer positions for transferring thin films to substrates by pressing members in the combinations are arranged at equal intervals, said substrate transport means transports the substrates at intervals matched with the arrangement and simultaneously stops the substrates at the transfer positions, and furthermore, all said pressing means perform pressing with the pressing members simultaneously.

8. The pattern film forming apparatus according to claim 6, which is compatible with formation of a pixel pattern in which pixels each having three sub-pixels are regularly arranged in a vertical direction and a horizontal direction and which includes first pressing means for forming a first sub-pixel, second pressing means for forming a second sub-pixel and third pressing means for forming a third sub-pixel.

9. The pattern film forming apparatus according to claim 8, wherein each of said first pressing means, said second pressing means, and said third pressing means uses a pressing member having an identical uneven pattern, and said substrate transport means transports the substrate while the substrate is shifted with respect to the pressing member for the transfer position by an amount corresponding to each of the sub-pixels.

10. The pattern film forming apparatus according to claim 8, wherein said sheet supply means intermittently transports the transfer sheet by an amount corresponding to each of the sub-pixels.

11. The pattern film forming apparatus according to claim 8, wherein the pressing member has a convex pattern formed continuously in a diagonal direction through shifting by one-third of a pixel in the horizontal direction and by one pixel in the vertical direction.

12. A pattern film forming apparatus for forming a predetermined pattern film on a surface of a substrate, comprising:

sheet supply means which supplies a transfer sheet on which a thin film is formed by means of a vacuum film forming method on a surface of a sheet-shaped material to a predetermined transfer position;

pressing means which has a pressing member with irregularities formed in accordance with the pattern film, and which presses one of the transfer sheet and the substrate with the pressing member to press the thin film against the substrate at the transfer position; and substrate transport means which supplies the substrate on which the pattern film is to be formed to the transfer position so that a pattern film formation surface is opposed to the thin film, and discharges the substrate from the transfer position after pressing, wherein said pressing member presses the thin film against the substrate from one of a reverse surface of the transfer sheet opposite to the thin film and a reverse surface of the substrate opposite to the pattern film formation surface to transfer the thin film to the substrate and to peel the thin film from the transfer sheet, wherein said pattern film has a regularly repeated pattern, and wherein said pressing member has regularly repeated irregularities in accordance with the pattern film, and a roughening device disposed upstream of the pressing means to roughen the surface of the substrate to the pattern film formation surface.

* * * * *